United States Patent
Handa et al.

(10) Patent No.: US 6,589,663 B2
(45) Date of Patent: Jul. 8, 2003

(54) AROMATIC POLYAMIDE FILM

(75) Inventors: Makoto Handa, Kanagawa (JP); Taro Oya, Kanagawa (JP)

(73) Assignee: Teijin Limited, Osaka (JP)

( * ) Notice: Subject to any disclaimer, the term of this patent is extended or adjusted under 35 U.S.C. 154(b) by 32 days.

(21) Appl. No.: 09/959,580

(22) PCT Filed: Feb. 28, 2001

(86) PCT No.: PCT/JP01/01508
§ 371 (c)(1),
(2), (4) Date: Oct. 30, 2001

(87) PCT Pub. No.: WO01/68340
PCT Pub. Date: Sep. 20, 2001

(65) Prior Publication Data
US 2003/0027976 A1 Feb. 6, 2003

(30) Foreign Application Priority Data
Mar. 13, 2000 (JP) ........................................ 2000-068706
Mar. 31, 2000 (JP) ........................................ 2000-097987

(51) Int. Cl.$^7$ .............................. B32B 27/00; G11B 5/73
(52) U.S. Cl. ................... 428/474.4; 428/141; 428/221; 428/332; 264/212; 264/298; 264/299; 264/309; 264/331.16; 264/331.19
(58) Field of Search .............................. 428/474.4, 221, 428/332, 141; 264/298, 299, 309, 331.19, 331.16, 212

(56) References Cited

U.S. PATENT DOCUMENTS

| 4,009,312 A | * | 2/1977 | Hayashi et al. ............. 428/213 |
| 4,752,643 A | * | 6/1988 | Imanishi et al. ............. 528/348 |
| 4,857,255 A | * | 8/1989 | Imanishi et al. ............. 264/216 |
| 5,011,643 A | | 4/1991 | Yang ........................... 264/171 |
| 5,094,913 A | | 3/1992 | Yang ........................... 428/364 |
| 5,874,519 A | * | 2/1999 | Nishimura et al. ......... 528/310 |
| 6,124,021 A | * | 9/2000 | Hanada ....................... 428/141 |
| 6,274,220 B1 | * | 8/2001 | Tsukuda et al. ............. 428/141 |
| 6,344,257 B1 | * | 2/2002 | Handa et al. ................ 428/141 |
| 6,376,043 B1 | * | 4/2002 | Handa et al. ................ 428/141 |

FOREIGN PATENT DOCUMENTS

| JP | 3-417 | 1/1991 |
| JP | 3-52776 | 8/1991 |
| JP | 3-74255 | 11/1991 |
| JP | 10-204188 | 8/1998 |
| JP | 9-220726 | 8/1999 |
| JP | 2000-336184 | 12/2000 |

OTHER PUBLICATIONS

International Search Report.

* cited by examiner

*Primary Examiner*—P. Hampton Hightower
(74) *Attorney, Agent, or Firm*—Sughrue Mion, PLLC

(57) ABSTRACT

The aromatic polyamide film of the present invention has microdomain structures having sizes of not less than 5 nm and not more than 600 nm. The film has an easily adhesive property and is suitable for use in printed circuit boards. In addition, it is preferable for use in magnetic recording media that the surface roughness Ra is not less than 0.25 nm and less than 25 nm and the planar orientation coefficient of the film is not less than 0.16 and not more than 0.60.

And, in the production method of the present invention, the relation of a time T (minute) to the thickness t (mm) is limited to the expression; $1.2t(t+1) \leq T$, wherein a time T means the time of from the start of the coagulation process to the peeling of the coagulated film from the support and the thickness t means the thickness of the thin filmy product on the support just after cast. By the production method, the film having the above-mentioned characteristics can be produced in good productivity.

8 Claims, No Drawings

AROMATIC POLYAMIDE FILM

TECHNICAL FIELD

The present invention relates to an aromatic polyamide film having excellent adhesivity and productivity and to a method for producing the aromatic polyamide film. In more detail, the present invention relates to the aromatic polyamide film having excellent dimensional stability, or excellent strength and surface smoothness and to the method for producing the aromatic polyamide film.

BACKGROUND ART

Aromatic polyamide films have excellent strengths and excellent heat resistance. Therefore, the aromatic polyamide films have been noted in the uses of magnetic recording media, heat transfer recording media, dielectric materials for capacitors, and printed circuit boards. And the consumption quantity of the aromatic polyamide films has been expanded. The application of the aromatic polyamide films to the magnetic recording media is proposed in, for example, Japanese Unexamined Patent Publication 51-129201 (1976).

Then, the polar groups on the surface of an aromatic polyamide film, produced by a conventional technique, participate in intermolecular bonds at a high rate. And the reactivity of the polar groups is extremely poor. Further, when a functional layer is laminated to the film, the adhesivity of the film to the functional layer is inferior. When the aromatic polyamide film is used, for example, for magnetic recording media or printed circuit boards, the adhesivity of the aromatic polyamide film to an adhesive for fixing magnetic coatings and copper foils is poor. For the problem, the application of an easily adhesive coating or the like was proposed, but the effect was insufficient.

Further, the aromatic polyamide film is produced by a solution film production method. In the method, a film-producing dope comprising an aromatic polyamide solution is first cast on a support from a nozzle in a thin film state, and the film is formed by coagulating the aromatic polyamide with removing the solvent component of the film-producing dope from the thin filmy product cast on the support. But, the production cost of the aromatic polyamide film produced by the solution film production method is higher than that of a thermoplastic polymer film, such as a polyester film, produced by a melt film production method. The problem is mostly caused from needing a long time for extracting the solvent from the thin filmy product cast on the support and further from requiring a high cost for recovering the solvent.

Methods for extracting the solvent from the thin film-like aromatic polyamide solution cast on the support are largely classified into a dry method and a wet method. In the dry method among the methods, an aromatic polyamide solution is cast from a nozzle on a support such as a drum or an endless belt to form the thin filmy product. A solvent is then evaporated from said thin filmy product with hot air or the like, thus drying the thin filmy product until to have a self-supporting property. This method has a problem that a long time is needed for diffusing the solvent to the surface of the thin filmy product and further evaporating the solvent from said surface. For shortening the time, it is effective to enhance the temperature and speed of the hot air used for the drying. But the rapid thermal drying treatment causes the boiling of the solvent, and hence roughens the surface of the obtained film. It is difficult to apply the film having the rough surface to the use of magnetic recording media which require good surface flatness. There is further a problem that, when the solvent has a flammable, explosive or corrosive property, an infinite sum of installation cost is necessary for recovering the solvent and for avoiding the adverse effects of the solvent to environments.

On the other hand, the wet methods are classified into a method for directly extruding the aromatic polyamide solution from a nozzle into a coagulation bath in a thin film-like shape, and a method for casting the aromatic polyamide solution on a support similarly to the above-mentioned dry method and then guiding the cast solution together with the support into a coagulation bath. The method for directly guiding the aromatic polyamide solution into the coagulation bath has an advantage that the efficiency for extracting the solvent is high, because there is not a support. However, the form of the thin filmy product extruded from the nozzle as the planar product is remarkably easily deformed, and it is therefore extremely difficult to obtain a satisfactory film. While, the method for casting the aromatic polyamide solution on the support and then guiding the cast solution together with the support into the coagulation bath has a defect that the extraction of the solvent needs a long time, because the solvent can substantially not be extracted from the side on the support, and a defect that wrinkles are liable to be generated on the film due to the transverse-direction contraction of the film on the extraction. Consequently, the surface flatness of the film is deteriorated. In particular, it was difficult to obtain a flat surface which could be applied as the base of a magnetic recording medium.

DISCLOSURE OF THE INVENTION

Accordingly, the object of the present invention is to solve the problems of prior art to obtain in good productivity the aromatic polyamide film which utilizes the excellent heat resistance and high stiffness of the aromatic polyamide and simultaneously has easy adhesivity enabling the application of the polyamide film to printed circuit boards. Another object of the present invention is to obtain the aromatic polyamide film which can be applied to magnetic recording media and has easy adhesivity and good surface flatness. The objects are achieved by the present invention mentioned below.

The aromatic polyamide film of the present invention is the film comprising the aromatic polyamide, characterized by having microdomain structures having sizes of not less than 5 nm and not more than 600 nm. If the sizes of the microdomain structures are less than 5 nm, the adhesivity of the aromatic polyamide film to adhesives is remarkably deteriorated.

On the other hand, if the sizes exceed 600 nm, the breaking elongation of the film is deteriorated to make it difficult to handle the film in processing processes.

The method for producing the aromatic polyamide film in the present invention is a method for producing the aromatic polyamide film via a casting process of a film-producing dope, a coagulation process, a water-washing process, and a drying process. In the casting process of a film-producing dope, the film-producing dope comprising an aromatic polyamide solution is cast from a nozzle on a support in a thin film-like shape. In the subsequent coagulation process, a film is formed by coagulating the aromatic polyamide with at least adopting a wet bath system comprising the aqueous solution of a good solvent for the aromatic polyamide and with removing the solvent component of the film-producing dope from the thin filmy product cast on the support. In the water-washing process, the coagulated film is washed with water and simultaneously peeled from the support. Therein, the peeling process may be carried out at any stage during the water-washing process in response to the state of the produced film. And, in the subsequent drying process, the coagulated film is dried.

Further, in the method for producing the aromatic polyamide film of the present invention, the relation of a time T (minute) and the thickness t (mm) satisfies the following expression (1); (wherein, a time T means the time from the start of the coagulation process to the peeling of the coagulated film from the support and the thickness t means the thickness of the thin filmy product on the support just after cast). Thereby, the aromatic polyamide film which ensures flatness and in which the microdomain structures having proper sizes are formed can be obtained in good productivity.

$$1.2t\,(t+1) \leq T \tag{1}$$

BEST MODE FOR CARRYING OUT THE INVENTION

The sizes of the microdomain structures in the present invention are preferably not less than 10 nm and not more than 500 nm, further preferably not less than 20 nm and not more than 400 nm, especially preferably not less than 30 nm and not more than 300 nm.

The microdomain structures are estimated to be originated by the separation of phases in the process for coagulating the thin filmy product cast on the support, and enable the remarkable improvement of such adhesivity as mentioned later, because a multiplicity of extremely small voids are formed among the domains. The microdomain structures are formed over the whole film, and the sizes of the microdomain structures can be controlled by conditions for producing the film. Namely, the microdomain structures are formed in the process for extracting the solvent from the thin filmy product comprising the aromatic polyamide solution cast on the support, and the sizes of the microdomain structures can therefore be controlled by the extraction conditions.

Therein, the aromatic polyamide of the present invention is a polymer whose main chains comprise aromatic nuclei and amide bond groups as main constituents, wherein the main chain-forming substituents on the aromatic nuclei may mainly be oriented at meta-positions or at para-positions. Among the polymers, a polymer (para-oriented aromatic polyamide), in which para-oriented main chain-forming substituents on the aromatic nuclei (among which are forming the main chain of the polymer) are contained at 50 to 100 percent by mole of all the repeating units, is preferable. The rate is more preferably 60 to 100 percent by mole, further preferably 70 to 100 percent by mole, and furthermore preferably 80 to 100 percent by mole.

As the aromatic polyamide, a polyamide which contains repeating units represented by the following general formula (I) and/or general formula (II) in an amount of not less than 50 percent by mole based on the total repeating units is preferable. The rate is more preferably not less than 60 percent by mole, further preferably not less than 70 percent by mole. Other repeating units may be copolymerized or blended within the residual rate range.

  (I)

  (II)

Wherein, $Ar_1$, $Ar_2$ and $Ar_3$ include five groups represented by the following formulas.

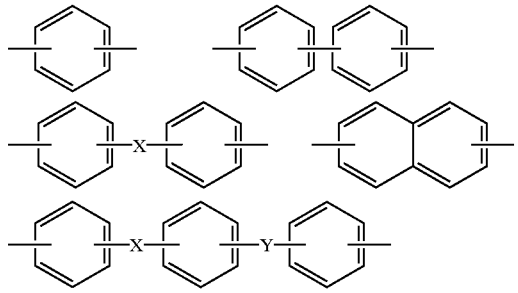

X and Y in the above-mentioned structural formulas are preferably selected from —O—, —CH$_2$—, —CO—, —SO$_2$—, —S—, and —C(CH$_3$)$_2$—. Further, the groups, in which some parts of hydrogen atoms on the aromatic rings in the above-mentioned structural formulas are substituted by substituents such as halogen groups (especially chlorine), nitro groups, $C_1$ to $C_3$ alkyl groups (especially methyl groups), $C_1$ to $C_3$ alkoxy groups, aryl groups, thioaryl groups, oxyaryl groups, and trialkylsilyl groups, are included. Further, the aromatic polyamides, in which hydrogen atoms in the amide bonds forming the polymer are substituted by other substituents, are also included.

From the aspect of characteristics, the polymer (para-oriented aromatic polyamide) in which the above-mentioned aromatic rings bound at the para-positions occupy not less than 50 percent by mole of the total aromatic rings is preferable. Thereby, the stiffness of the film is enhanced, and the heat resistance is also improved. The rate of the aromatic rings bound at the para-positions is more preferably not less than 60 percent by mole, furthermore preferably not less than 70 percent by mole.

In addition, it is preferable that the aromatic rings, in which hydrogen atoms on the rings are partially substituted by the above-mentioned substituents, occupy at a rate of not less than 30 percent by mole based on the total aromatic rings. Thereby, the moisture resistance of the film is improved, and the characteristics of the film, such as the change of the dimension and the deterioration of the stiffness, due to the absorption of moisture are improved. The rate is preferably not less than 50 percent by mole, more preferably not less than 70 percent by mole. Herein, more preferable substituents are a halogen group, an alkyl group, an alkoxyl group or a trialkylsilyl group.

Eleven aromatic nuclei represented by the following structural formulas can be exemplified as the aromatic nuclei having the para-orientations.

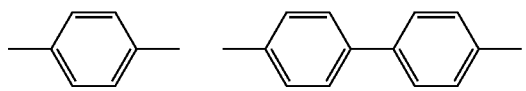

-continued

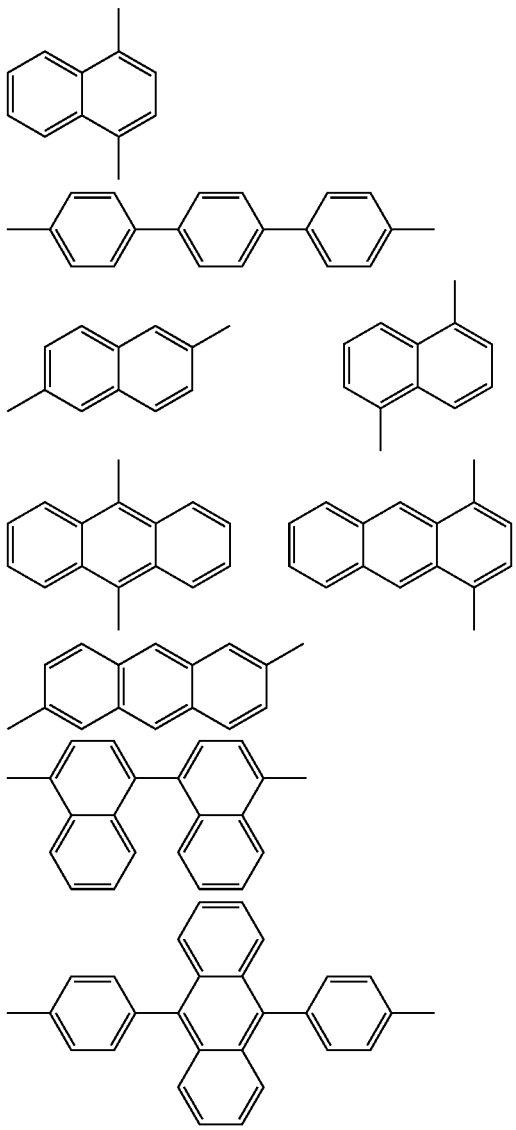

The aromatic polyamide of the present invention can be produced by conventionally known methods. Therein, it is preferable that the inherent viscosity (a value measured at 30° C. by using a solution of 0.5 g of the polymer solved in 100 ml of sulfuric acid at) of the polymer is preferably not less than 0.5, more preferably 1.0 to 8.0.

The aromatic polyamide of the present invention may be blended with an antioxidant, an antistatic agent, a mold release agent, one or more other additives and one or more other polymers in such an extent as not deteriorating the physical properties of the film.

The aromatic polyamide film of the present invention is preferably used as a composite material with a metal. Namely, it is used in the form that a magnetic metal layer, a metal element, a metal wiring or the like is formed on the film. Therein, the film is exposed to high temperature, when processed or used. When the obstruction of the functions of the composite material due to the generation of a halogen compound is worried, the ratio of halogen atoms to hydrogen atoms bound to aromatic rings in the repeating units of the aromatic polyamide is preferably controlled to no more than 1/3. The ratio is more preferably no more than 1/6, or it is especially preferable that the halogen is not contained.

The coefficient of thermal expansion of the aromatic polyamide film of the present invention is preferably 0 to 36 ppm/° C. in the range of 30° C. to 280° C. When the film is laminated to a copper foil and then heated, the curvature of the laminate can thereby be reduced. The coefficient of thermal expansion is more preferably 1 to 30 ppm/° C., further preferably 2 to 25 ppm/° C.

The breaking elongation of the aromatic polyamide film of the present invention is preferably not less than 5% and less than 100%. It is preferable to satisfy the characteristic, because the suitability of the aromatic polyamide film for a processing process is improved. The breaking elongation is more preferably not less than 6% and less than 95%, further preferably not less than 7% and less than 90%, especially preferably not less than 8% and less than 85%.

The centerline average surface roughness Ra of the aromatic polyamide film of the present invention is preferably not less than 0.25 nm and not more than 25 nm. The value of the surface roughness Ra is more preferably not less than 0.3 nm, further preferably not less than 0.4 nm, especially preferably not less than 0.5 nm. In addition, the value of the surface roughness Ra is more preferably not more than 20 nm, furthermore preferably not more than 15 nm, especially preferably not more than 12 nm. When the surface roughness Ra is less than 0.25 nm, the handling of the aromatic polyamide film in the film-producing process and in the processing process is difficult, because the slip property of the aromatic polyamide film is not good, while it is also difficult to apply the aromatic polyamide film to the use of magnetic recording media due to the deterioration of electromagnetic transducing characteristics, when the surface roughness Ra is not less than 25 nm.

As a method for controlling the surface roughness of the aromatic polyamide film, a method for adding fine particles to the aromatic polyamide film, a method for coating the surface of the aromatic polyamide film, or the like may jointly be employed in addition to the method for controlling the sizes of the above-mentioned microdomain structures.

When the fine particles are added to the aromatic polyamide film, the following fine particles may be used. Inorganic fine particles such as the fine particles of metal compounds, for example, $SiO_2$, $TiO_2$, $Sb_2O_3$ and $ZrO_2$, the fine particles of metals, and the fine particles of a compound represented by the general formula: $M(OH)_x$ or $M_2(CO)_x$ (wherein, M is at least one metal element selected from the groups Ia and Ia in the periodic table, X is the number of 1 to 2). Organic fine particles such as silicone resin fine particles, polyimide fine particles, cross-linked copolymer fine particles, cross-linked polyester resin fine particles, acrylic resin fine particles or fluororesin fine particles (Teflon fine particles). Among the fine particles, the inorganic fine particles are more preferable than the organic fine particles from the viewpoint of heat resistance, and at least one kind of fine particles (especially $SiO_2$) selected from $SiO_2$, $Sb_2O_3$, and $ZrO_2$ are especially preferable, because of having excellent dispersibility. Two or more kinds of the fine particles to be added may jointly be used.

The average particle diameter of the above-mentioned fine particles is preferably not less than 5 nm and not more than 600 nm, more preferably not less than 10 nm and not more than 500 nm, further preferably not less than 20 nm and not more than 400 nm, especially preferably not less than 30 nm and not more than 300 nm. The content of the fine particles is preferably not less than 0.001 percent by weight and less than 10 percent by weight, more preferably not less than 0.01 percent by weight and less than 1 percent by weight, further preferably not less than 0.03 percent by weight and less than 0.7 percent by weight, especially preferably not less than 0.05 percent by weight and less than 0.5 percent by weight.

The planar orientation coefficient of the aromatic polyamide film of the present invention is preferably not less than 0.16 and not more than 0.60. The planar orientation coefficient is more preferably not less than 0.20, further preferably not less than 0.25, especially not less than 0.30, in particular not less than 0.35, and not more than 0.58, further not more than 0.55. When the planar orientation coefficient is less than 0.16, the orientation of the aromatic polyamide film is insufficient, and the strength and Young's modulus of the aromatic polyamide film are also therefore insufficient. Especially when a magnetic tape is produced from the aromatic polyamide film, the magnetic tape is insufficiently brought into a magnetic head, and sufficient electromagnetic transducing characteristics can thereby not be obtained. On the other hand, it is not preferable that the coefficient of plane orientation exceeds 0.60, because the frequency of the breakage of the aromatic polyamide film is remarkably increased when the aromatic polyamide film is produced, and further because the productivity of the aromatic polyamide film is drastically lowered.

The Young's modulus of the aromatic polyamide film of the present invention in an arbitrary in-plane direction is preferably not less than 6,000 N/mm$^2$ and less than 40,000 N/mm$^2$, more preferably not less than 7,000 N/mm$^2$ and not more than 30,000 N/mm$^2$, further preferably not less than 8,000 N/mm$^2$ and not more than 2,500 N/mm$^2$, especially preferably not less than 9,000 N/mm$^2$ and not more than 20,000 N/mm$^2$. When the Young's modulus is less than 6,000 N/mm$^2$, the contact state of a magnetic tape produced from the aromatic polyamide film with a head is unstable, and the electromagnetic transducing characteristics of the magnetic tape is deteriorated. On the other hand, it is not preferable that the Young's modulus exceeds 40,000 N/mm$^2$, because the film producing property of the aromatic polyamide is deteriorated and hence because the productivity of the aromatic polyamide film is drastically lowered.

The thickness of the aromatic polyamide film of the present invention is preferably not less than 0.1 μm and not more than 500 μm, more preferably 0.3 to 350 μm, further preferably 0.5 to 250 μm, especially preferably 1 to 200 μm.

The aromatic polyamide film of the present invention may be produced by an arbitrary method, if the method is a film-producing method capable of imparting the above-mentioned characteristics, the so-called solution type film-producing method. The solution type film-producing method includes a dry and wet method, a dry method, and a wet method, among which the dry and wet method and the wet method, especially the wet method, are preferable.

In the method for producing the aromatic polyamide film of the present film, the numerical value of a time T leading to the peeling of the coagulated film from the support is not less than 1.3 t(t+1), more preferably 1.4 t(t+1), especially preferably not less than 1.5 t(t+1).

In the casting process of the film-producing dope, the aromatic polyamide solution (the film-producing dope) may be a polyamide solution, obtained as it is by the production of the polyamide, but may be prepared by once isolating the polymer from said solution and then redissolving the isolated polymer in an organic solvent or an inorganic solvent such as sulfuric acid.

The method for producing the aromatic polyamide includes a low temperature solution polymerization method, an interfacial polymerization method, a method for reacting an isocyanate with a dicarboxylic acid, and a direct polycondensation method using a dehydration catalyst, among which the low temperature solution polymerization method is preferable, because the polymer having a high polymerization degree can easily be obtained. Namely, a method for polymerizing an acid chloride with a diamine in an aprotic organic polar solvent such as N-methylpyrrolidone (NMP), dimethylacetamide (DMAc) or dimethylformamide (DMF) is preferable. Therein, hydrogen chloride is by-produced on the reaction of the acid chloride with the diamine. When the hydrogen chloride is neutralized, an inorganic neutralizing agent such as calcium hydroxide, calcium carbonate or lithium carbonate, or an organic neutralizing agent such as ethyleneoxide, propyleneoxide, ammonia, triethylamine, triethanolamine or diethanolamine is preferably used. The obtained polymer solution may be used as the film-producing raw liquid (dope) as it is, but the polymer may once be isolated from the obtained polymer solution and then redissolved in the above-mentioned organic solvent or the inorganic solvent such as sulfuric acid to prepare the film-producing raw liquid (dope).

To the aromatic polyamide solution, if desired, an inorganic salt such as calcium chloride, magnesium chloride, lithium chloride or lithium nitrate may be added as a dissolution auxiliary. The aromatic polyamide solution as the film-producing dope has preferably a polymer concentration of 2 to 40 percent by weight, further preferably 3 to 30 percent by weight.

In addition, when the fine particles for controlling the surface roughness of the film are added to the aromatic polyamide solution, methods for the addition include a method for preliminarily adding the fine particles to a polymerization solvent or a dilution solvent and a method for directly adding the fine particles to the film-producing dope. The method for preliminarily adding the fine particles to the polymerization solvent is preferable, because the fine particles can be added and mixed under a low viscosity and further because the change of the viscosity can be reduced. It is also possible to use solid fine particles having a neutralizing ability for the neutralization reaction after the polymerization reaction, thus using the left fine particles as the fine particles for forming lumps. Further, a method for reprecipitating, washing and then gradually dissolving the once produced polymer in a solvent containing fine particles or a method for redissolving the reprecipitated polymer in a solvent and then mixing the obtained polymer solution with a solvent containing fine particles may also preferably be adopted.

The film-producing dope (aromatic polyamide solution) prepared as mentioned above is preferably cast on a support, when extruded from a nozzle, from the viewpoints of the flatness and surface smoothness of the film. A metal roll, a metal-made endless belt, a polymer film, a metal foil, or the like may be used as the support. The support may singly be used, or two or more of the supports may combinedly be used.

When the metal roll is used as the support, it is preferable to use the metal roll having a diameter of not less than 20 cm, more preferably not less than 30 cm, especially preferably not less than 40 cm, because it is difficult to obtain a sufficient contact time with the film, when the diameter of the roll is too small. When the metal-made endless belt is used, it is preferable to use the metal-made endless belt having a thickness of 0.3 to 3.0 mm, further preferably 0.4 to 2.5 mm, especially preferably 0.5 to 2.0 mm, from the viewpoint of handling. When the polymer film or the metal foil is used, the polymer film or the metal foil having a thickness of preferably not less than 0.5 μm and less than 300 μm, more preferably not less than 1 μm and less than 250 μm, further preferably not less than 2 μm and less than 200 μm, especially preferably not less than 3 μm and less than 150 μm, is used, and it is also preferable to use the polymer film or metal foil having the larger surface roughness of the back surface (which is not brought into contact with the film-producing dope) than that of the surface (which is brought into contact with the film-producing dope) to improve the handling property. Further, a mold release treatment using a silicone-based resin, a fluororesin, or the like, for imparting a mold release property may also be applied to the surface of the support.

It is preferable that the surface roughness Ra of the support is not less than 0.5 nm and not more than 50 nm, because the surface of the finally obtained film is maintained smooth. The surface roughness Ra is more preferably not less than 1 nm and not more than 45 nm, further preferably not less than 2 nm and not more than 40 nm, especially preferably not less than 4 nm and not more than 35 nm.

For the extraction of the solvent from the film-producing dope in the coagulation process, it is preferable from the point of extraction efficiency to use a bath (coagulation bath) using a good solvent for said aromatic polyamide. The bath for the extraction comprises an aqueous solution, especially the aqueous solution of the above-mentioned aprotic organic polar solvent. By a dry type method, the efficient of the extraction efficiency is bad, and it is difficult to produce the film having the microdomain structures.

In the coagulating process, a treatment, such as a treatment for drying the aromatic polyamide solution cast on the support with hot air for a very short time or a treatment for blowing air having a constant temperature and a constant humidity on the cast aromatic polyamide solution to achieve the optical isotropy of the liquid crystal solution, may, if necessary, be applied to the aromatic polyamide solution cast on the support, before guided into the wet type bath. The time for the treatment is also contained in the time T (minute) from the start of the coagulation process to the peeling of the coagulated film from the support in the present invention.

In the production method of the present invention, it is preferable to orient the coagulated film in at least one direction to give an area stretch ratio of 1.01 to 15 during the process after the finish of the coagulating process. Thereby, the aromatic polyamide film which ensures good flatness and simultaneously in which the microdomain structures having proper sizes have been formed can also be obtained in good productivity. The area stretch ratio is preferably 1.05 to 13, further preferably 1.1 to 11, especially preferably 1.2 to 10. The orientation temperature in a wet state including the state in a water bath is preferably room temperature to 95° C. Or, the orientation temperature in a dry state including the state in the drying process is preferably 100 to 600° C.

After the finish of the coagulating process, the coagulated film, namely the aromatic polyamide film is guided to the water-washing process and then subjected to a solvent-removing treatment and a desalting treatment in the wet bath. During the water-washing process, the aromatic polyamide film is peeled from the support. The peeling work may be carried out at any stage during the water-washing process in response to the state of the produced film. Namely, the peeling work may be carried out before, during or after the water-washing work.

In the drying process after the water-washing process, the drying temperature is preferably 50 to 250° C., further preferably 70 to 240° C., especially preferably 80 to 220° C. The drying time is preferably 1 second to 30 minutes, further preferably 3 seconds to 20 minutes, especially preferably 5 seconds to 15 minutes. At the time, one or more heating rolls or an oven may be used.

In addition, after the drying process, it is preferable to thermally treat the coagulated film at a temperature of not less than 250° C. and not more than 700° C. By the thermal treatment, the effect of the present invention becomes more remarkable. The thermal treatment temperature is preferably 260 to 650° C., further preferably 270 to 600° C., especially 280 to 550° C. The thermal treatment time is preferably 1 second to 60 minutes, further preferably 5 seconds to 30 minutes, especially preferably 10 seconds to 20 minutes.

As the oven used for the drying process or the subsequent thermal treatment, a clip-tenter, a pin-tenter or the like may preferably be used.

The method for orienting the coagulated film, at the stage that the coagulated film is guided to the heating roll or the oven, includes a usual transverse orientation method using the clip-tenter, a simultaneous biaxial orientation method using a simultaneous biaxial orientation machine, and a machine direction (longitudinal) orientation method comprising heating a water-removed film with an infrared light heater, an induction heating roll or the like and orienting the film by the utilization of a difference between the circumferential speeds of a low speed roll and of a high speed roll. The methods may suitably be combined with each other. If necessary, the biaxially oriented film may again be oriented in the machine direction, in the transverse direction or in both the machine and transverse directions, or be treated with relaxation while heated.

EXAMPLES

The physical property values and characteristics in the present invention are measured or defined as follows.
(1) Size of the Microdomain Structure The small piece of the film is embedded in an epoxy resin (Epomount, produced by Refinetec Co. Ltd.), sliced together with the embedding resin in a thickness of 50 nm with a microtome (Microtome 2050, manufactured by Reinchert-Jung Corp.) and then observed with a transmission electron microscope (LEM-2000, manufactured by Topcon Co. Ltd.) at an acceleration voltage of 100 KV and a magnification of 100,000 times. Among the observed small film pieces, the film piece in which domain structures have been formed is measured to determine the diameter of a circle corresponding to the measured domain area. The diameters of the circles corresponding to 100 domain areas are determined, and the average value of the diameters is the size (nm) of the domain structure.
(2) Average Particle Diameter of the Fine Particles The diameters of the fine particles are measured with a particle diameter-measuring instrument (CP-50 type Centrifugal Particle Size Analyzer, manufactured by Shimadzu Seisakusho Co. Ltd.). The cumulative curve, of the particles having particle diameters and of the amounts of the particles, is calculated on the basis of the obtained orientation precipitation curve, and a particle diameter corresponding to 50 percent by weight is read from the cumulative curve. The value is an average particle diameter (μm)(see [Particle size measurement technique], issued by Nikkan Kogyo Shinbun, 1975, p 242 to 247).

(3) Thickness of the Film

The thickness of the film is measured with an electronic micrometer (manufactured by Anritsu Denshi Co. Ltd.).

(4) Surface Roughness (Ra)

The centerline average roughness (Ra) is the value defined in JIS B0601, and is measured with a probe-type surface roughness meter (Surfcorder SE-30C, manufactured by Kosaka Kenkyusho Co. Ltd.) in the present invention.

The measuring conditions are as follows.

| (a) | Tip diameter of the probe: 2 $\mu$m |
| (b) | Measuring pressure: 30 mg |
| (c) | Cut-off: 0.25 mm |
| (d) | Measuring length: 2.5 mm |
| (e) | Method for summarizing data: repeatedly measuring the same sample six times, removing the largest value and then showing the average value of the residual five data. |

(5) Peel Strength of Copper Foil

An adhesive comprising the following composition is coated on both the sides of a film so as to give a thickness of 5 $\mu$m after dried at 110° C. for three minutes.

The composition of the coating:

A multi-functional epoxy-introduced epibisepoxy about 56 percent by weight.

| | |
|---|---|
| A highly brominated bisphenol A type epoxy | 20 percent by weight. |
| A bisphenol A type novolak resin | 24 percent by weight. |
| 2-Ethyl-4-methylimidazole | 0.04 percent by weight. |

The adhesive coating: the 50 percent by weight methylethylketone solution of the above-mentioned adhesive composition.

Then, the rough surfaces of 9 $\mu$m-thick electrolytic copper foils (the front and back surfaces are different each other) are superposed on both the sides of the above-mentioned adhesive laminate, held under a pressure of 160 kg/cm$^2$ at 200° C. for 1 hour, and then cooled. The taken copper foil laminate is slit in a width of 1 cm and then subjected to a peeling test by the method of JIS C6481. The used peel load is divided by the width of the sample film, and the obtained value is a peel strength (g/cm).

(6) Coefficient of Thermal Expansion of the Film

A thermal mechanical test machine (TM 3000, manufactured by Shinkuriko Co. Ltd.) is used to measure the coefficient of thermal expansion of the film as follows.

A film piece as a specimen is cut out in a width of 5 mm. The specimen is set to chucks having a distance of 15.05 mm (=15,050 $\mu$m) therebetween, and a load of 80 g/mm$^2$ is applied. The temperature of the specimen is raised from 30° C. to 150° C. at a rate of 10° C./minute and then lowered to 30° C. with air. When the temperature of the specimen is 30° C., the length of the specimen between the chucks is measured. And a coefficient of thermal expansion (ppm/° C.) is determined by the following equations.

Standard length L ($\mu$m) of the specimen=15050

Displacement difference $\Delta$L ($\mu$m)=(the length of the specimen at 280° C.—the length of the specimen at 30° C.)

Temperature difference $\Delta$t (° C.)=28030−30 =250

Coefficient of thermal expansion (ppm/° C.)=($\Delta$L/L)×10$^6$$\Delta$t (7) Breaking Strength of the Film A sampled film having a width of 10 mm and a length of 150 mm is pulled between chucks having a distance of 100 mm therebetween at a tensile strength of 150 mm/minute with a tension tester (Tensilon, manufactured by Toyo Boldwin Co. Ltd.) in a room controlled to a temperature of 20° C. and a relative humidity of 50% until to break, and the breaking strength of the film is calculated from a breaking elongation on the obtained stress-strain curve.

(8) Young's Modulus of the Film

A sampled film having a width of 10 mm and a length of 150 mm is pulled between chucks having a distance of 100 mm therebetween at a pulling rate of 10 mm/minute with a tension tester (Tensilon, manufactured by Toyo Boldwin Co. Ltd.) in a room controlled to a temperature of 20° C. and a relative humidity of 50%, and the Young's modulus of the film is calculated from the tangent in the standing portion of the obtained stress-strain curve.

(9) Electromagnetic Transducing Characteristics

A film is coated with the below-mentioned magnetic coating in a coating thickness of 1.2 $\mu$m, subjected to an orientation treatment in a direct current magnetic field of 2,500 gauss, thermally dried at 120° C., subjected to a supercalender treatment (linear pressure: 300 kg/cm, temperature: 90° C.), and then wound up. The wound roll is left in a 55° C. oven for three days.

Preparation of the magnetic coating:

The magnetic coating is obtained by charging the below-shown composition in a ball mill, kneading and dispersing the charged composition for 16 hours, mixed with 5 parts by weight of an isocyanate compound (Desmodur L, produced by Bayer AG.), and then applying a high speed shear dispersion treatment to the mixture for one hour.

| Composition of the coating: | |
|---|---|
| Acicular Fe fine particles | 100 parts by weight |
| Vinyl chloride-vinyl acetate copolymer (S-Lec 7A, produced by Sekisui Kagaku Co. Ltd.) | 15 parts by weight |
| A thermoplastic polyurethane resin | 5 parts by weight |
| Chromium oxide | 5 parts by weight |
| Carbon black | 5 parts by weight |
| Lecithin | 2 parts by weight |
| A fatty acid ester | 1 parts by weight |
| Toluene | 30 parts by weight |
| Methylethylketone | 50 parts by weight |
| Cyclohexanone | 70 parts by weight |

Further, the film side opposite to the magnetic recording layer is coated with a coating having the below-mentioned composition in a thickness of 0.8 $\mu$m as the back coat layer, and then dried. The film is cut to obtain magnetic tapes.

| Composition of the back coat layer: | |
|---|---|
| Carbon black | 100 parts by weight |
| A thermoplastic polyurethane resin | 60 parts by weight |
| An isocyanate compound (Coronate L, produced by Nippon Polyurethane Ind. Co. Ltd.) | 18 parts by weight |
| A silicone oil | 0.5 part by weight |
| Methylethylketone | 250 parts by weight |
| Toluene | 50 parts by weight |

Subsequently, the characteristics of the tape are measured with the following commercially available equipment.

Used equipment:

8 mm video tape recorder: EDV-6000, manufactured by Sony Co. Ltd.

C/N measurement: a noise meter, manufactured by Shibasoku Co. Ltd.

Signals having a frequency of 7.4 MHz are recorded on the tape. The ratio of 6.4 MHz regenerated signal value to 7.4 MHz regenerated signal value is the C/N of the tape. The C/N of the comparative example 1 is 0 dB. The C/N of the tape is represented by the relative value.

(10) Adhesivity of Magnetic Surface

A produced magnetic tape is adhered to Scotch tape No. 600 (produced by 3M Corp.) in an air bubble-free state, leveled with a manual load roll described in JIS C2701 (1975) from the side of the Scotch tape, and then slit in a width of 8 mm. The obtained laminate sample is subjected to a T-peeling treatment using Tensilon STROGRAPH-M1, manufactured by Toyo Seiki Co. Ltd., at a head speed of 50 mm/minute to determine the peel strength. The peel strength is divided by the width (8 mm) of the tape to determine the adhesivity of the magnetic surface as g/cm.

(11) Planar Orientation Coefficient

A sample having sizes of 1 mm×10 mm in the machine (longitudinal) direction and in the transverse direction, respectively, is cut out, embedded in an epoxy resin, and then sliced in a thickness of 0.5 μm. The sliced sample is subjected to retardation measurement using a polarization microscope to determine birefringences in the directions, respectively. Then, the planar orientation coefficient is determined by the following expressions.

Birefringence 1=refractive index in the machine direction—refractive index in the thickness direction Birefringence 2=refractive index in the transverse direction—refractive index in the thickness direction Plane orientation coefficient=½ (birefringence 1+birefringence 2)

Example 1

50 Percent by mole of para-phenylenediamine and 50 percent by mole of 3,4'-diaminophenylether as an aromatic diamine component were dissolved in N-methylpyrrolidone (NMP) in which spherical silica fine particles having an average particle diameter of 0.3 μm were dispersed in a particle content of 0.2 percent by weight based on the polymer. Terephthalic chloride corresponding to 100 percent by mole was added to the solution to polymerize with the aromatic diamine component. Then, the by-produced hydrogen chloride was neutralized with calcium hydroxide to give the film-producing dope (the inherent viscosity of the polymer: 3.6) having a polymer concentration of 6.3 percent by weight.

The obtained film-producing dope was heated at 100° C., allowed to pass through a stainless steel-made nonwoven fabric filter having an average aperture of 8 μm, and then cast from a 105° C. nozzle on a 1.5 m diameter rotary metal drum set in a coagulation bath. The composition of the coagulation bath was a 40 percent by weight aqueous solution of N-methylpyrrolidone, and the temperature of the composition was 40° C. The film-producing dope (thickness: 95 μm) cast on the rotary metal drum was immediately guided into the coagulation bath, peeled from the metal drum after 10 seconds, and then subjected to a solvent-removing treatment and a salt-removing treatment in a 50° C. aqueous solution. Subsequently, the obtained film was dried with a clip-tenter at 200° C. for 30 seconds, and then thermally treated at 320° C. for one minute and 30 seconds to give the aromatic polyamide film having the final thickness of 6 μm.

Microdomain structures exist in the obtained film, and the size of the microdomain structures was 200 nm. The other characteristics of the film are shown in Table 1 and Table 2.

Example 2

The same film-producing dope as in Example 1 was similarly extruded from a nozzle and then cast on a stainless steel-made belt polished in a mirror surface state. The cast film-producing dope (thickness: 190 μm) was guided into a coagulation bath having the same conditions as in Example 1 in a state loaded on the belt without dried, peeled from the belt after 30 seconds, subjected to a solvent-removing treatment and a salt-removing treatment in a 50° C. aqueous solution, dried with a clip-tenter at 200° C. for 30 seconds, and then thermally treated at 400° C. for 30 seconds to give the aromatic polyamide film having the final thickness of 12 μm.

The characteristics of the obtained film are shown in Table 1 and Table 2.

Example 3

An aromatic polyamide film-producing dope (polymer inherent viscosity: 3.5) was obtained by the same method as in Example 1 except that the particles were not added on the polymerization and that a mixture liquid of 70 percent by mole of the para-phenylenediamine with 30 percent by mole of the 3,4'-diaminophenylether was used as an aromatic diamine component. The film-producing dope was extruded from a nozzle similarly to Example 1 and then cast, in a 400 μm-thick film state, on a 150 μm-thick biaxially oriented polyethylene terephthalate film (PET film).

Subsequently, the cast dope was immediately guided into a 50° C. coagulation bath comprising a 30 percent by weight aqueous solution of N-methylpyrrolidone (NMP), peeled from the PET film after one minute, charged in a 60° C. aqueous solution to remove the solvent and the salt, dried and then thermally treated to give the aromatic polyamide film having the final thickness of 25 μm. Therein, the drying treatment was carried out at 200° C. for one minute, and the thermal treatment was also performed at 380° C. for two minutes. The characteristics of the obtained film are shown in Table 1 and Table 2.

Example 4

A mixture liquid of 2-chloro-para-phenylenediamine in an amount corresponding to 80 percent by mole with 4,4'-diaminodiphenylether in an amount corresponding to 20 percent by mole as an aromatic diamine component was dissolved in N-methylpyrrolidone (NMP) to which spherical silica fine particles having an average particle diameter of 0.45 μm were added to give a particle content of 0.3 percent by weight based on the polymer. The obtained solution was mixed with 2-chloroterephthalic chloride in an amount corresponding to 100 percent by mole and then stirred for two hours to finish the polymerization. Subsequently, the hydrogen chloride by-produced on the polymerization was neutralized by the addition of lithium hydroxide in four portions to give the film-producing dope (polymer inherent viscosity: 3.9) having a polymer concentration of 10 percent by weight.

The obtained film-producing dope was extruded similarly to Example 3, cast on a PET film in a thickness of 250 μm, heated at 100° C. for one minute in a vertical oven, guided into a 50° C. coagulation bath comprising a 30% aqueous solution of NMP, peeled from the PET film after 30 seconds, subjected to a solvent-removing treatment and a salt-removing treatment in a 60° C. water-washing bath, dried at 200° C. for one minute, and then thermally treated at 280° C. for two minutes to give the aromatic polyamide film having the final thickness of 25 μm. The physical properties of the obtained film are shown in Table 1 and Table 2.

Example 5

70 Parts by weight of anhydrous lithium chloride and then 48.6 parts by weight of para-phenylenediamine were dissolved in 1,000 parts by weight of N-methylpyrrolidone in a polymerization device. The obtained solution was cooled at 8° C., and 91.4 parts by weight of terephthalic dichloride was then added to the cooled solution in a powdery state at a time. Since solidified in the cheese-like state after several minutes, the polymerization reaction product was taken out from the polymerization device, immediately transferred to a twin-screw closed type kneader, and finely crushed in the kneader. Subsequently, the obtained finely crushed product was transferred to a Henschel mixer, mixed with the approximately same amount of water, further crushed, filtered, washed with hot water several times, and then dried in 110° C. hot air to give the para-phenylene terephthalamide (PPTA) having an inherent viscosity of 6.1.

Subsequently, the PPTA having the inherent viscosity of 6.1 was dissolved in concentrated sulfuric acid having a concentration of 99.5% to prepare the dope having a polymer concentration of 12%. The viscosity of the dope was 4,600 poises, when measured at 60° C. The dope had an optically anisotropic property. The dope was deaerated under vacuum, while maintained at 60° C. The dope was transferred from a tank through a film by the use of a gear pump, cast from a T-die having a slit of 0.4 mm×700 mm on a tantalum-made belt polished in a mirror surface state in a thickness of 210 μm, blown with air having a relative humidity of about 25% and a temperature of about 120° C. to convert the cast dope into an optically isotropic dope, and then guided together with the belt into a 20° C. 60° C. aqueous sulfuric acid solution to coagulate the cast dope. After 30 seconds, the coagulated film was peeled from the belt, subjected to a solvent-removing treatment and a salt-removing treatment in a 60° C. water-washing bath, dried at 220° C. for two minutes, and then thermally treated at 500° C. for two minutes to give the aromatic polyamide film having the final thickness of 25 μm. The characteristics of the obtained film are shown in Table 1 and Table 2.

Example 6

A film-producing dope was obtained in the same method as in Example 1 except that the added fine particles ware changed from the spherical silica fine particles into spherical silicone resin fine particles having an average particle diameter of 0.5 μm.

The obtained film-producing dope was cast on a 150 μm PET film in a thickness of 800 μm similarly to Example 3, immediately guided into a 45° C. coagulation bath comprising a 40 percent by weight aqueous solution of NMP. After two minutes and 30 seconds, the coagulated film was peeled from the PET film, subjected to a solvent-removing treatment and a salt-removing treatment in a 65° C. water-washing bath, dried at 240° C. for 1.5 minutes, and further thermally treated at 440° C. for one minute to give the aromatic polyamide film having the final thickness of 50 μm.

The characteristics of the obtained film are shown in Table 1 and Table 2.

Example 7

Except that the final thermal treatment was not performed, the treatments were carried out similar to Example 2 to give the aromatic polyamide film having the final thickness of 12 μm. The characteristics of the obtained film are shown in Table 1 and Table 2.

Comparative Example 1

The same film-producing dope as in Example 1 was similarly extruded from the nozzle and then cast on a stainless steel-made belt polished in a mirror surface state. The cast film-producing dope (thin filmy product) having a thickness of 400 μm was dried at 100° C. for two minutes, and further dried at 120° C. for three minutes and at 150° C. for five minutes to give the non-oriented film having a self-supporting property. The non-oriented film was peeled from said belt, guided into a 60° C. water tank to remove the solvent and the salt, dried a 200° C. for one minute, and then thermally treated at 380° C. for two minutes to give the aromatic polyamide film having the final thickness of 25 μm.

A microdomain structure was not recognized in the obtained film, and the adhesivity of the film to copper foil was low. The characteristics of the film are shown in Table 1 and Table 2.

Comparative Example 2

The same film-producing dope as in Example 1 was similarly extruded from the nozzle and then cast on a 150 μm-thick PET film in a thickness of 400 μm. The cast dope was immediately guided into a 40° C. coagulating bath comprising a 10 percent by weight aqueous solution of NMP, peeled from the PET film after 15 seconds, subjected to a solvent-removing treatment and a salt-removing treatment in a 50° C. water-washing bath, dried at 200° C. for one minute, and then thermally treated at 380° C. for two minutes to give the aromatic polyamide film having the final thickness of 25 μm.

The obtained film had a white appearance, and it was visually observed that the film had fine wrinkles on the surface The film further had good adhesivity to copper foils, but the film was a fragile film having a very low breaking elongation. The characteristics of the film are shown in Table 1 and Table 2.

As obvious from Table 1 and Table 2, the films of Examples have excellent adhesivity and elongations capable of resisting to processability, while the films of Comparative Examples can not satisfy the characteristics.

TABLE 1

| | Thickness just after cast mm | Microdomain structure Presence or absence of existence | Size nm | Thermal treatment after dried Temperature ° C. | Time minute |
|---|---|---|---|---|---|
| Example 1 | 0.095 | presence | 200 | 320 | 1.5 |
| Example 2 | 0.19 | presence | 90 | 400 | 0.5 |
| Example 3 | 0.4 | presence | 160 | 380 | 2 |
| Example 4 | 0.25 | presence | 15 | 280 | 2 |
| Example 5 | 0.21 | presence | 20 | 500 | 2 |
| Example 6 | 0.80 | presence | 250 | 440 | 1 |
| Example 7 | 0.19 | presence | 90 | nothing | |
| Comparative Example 1 | 0.40 | absence | | 380 | 2 |
| Comparative Example 2 | 0.40 | presence | 650 | 380 | 2 |

TABLE 2

| | Final thickness of film μm | Coefficient of thermal expansion ppm/° C. | Breaking elongation % | Film surface roughness nm | Copper foil peel strength g/cm |
|---|---|---|---|---|---|
| Example 1 | 6 | 13 | 40 | 14 | 120 |
| Example 2 | 12 | 15 | 28 | 14 | 130 |
| Example 3 | 25 | 18 | 35 | 10 | 110 |
| Example 4 | 25 | 11 | 45 | 20 | 60 |
| Example 5 | 25 | 8 | 33 | 4 | 55 |
| Example 6 | 50 | 32 | 30 | 18 | 150 |
| Example 7 | 12 | −50 | 48 | 14 | 150 |
| Comparative Example 1 | 25 | 15 | 40 | 14 | 20 |
| Comparative Example 2 | 25 | 20 | 4 | 100 | 130 |

Example 8

50 Percent by mole of para-phenylenediamine and 50 percent by mole of 3,4'-diaminophenylether as an aromatic diamine component were dissolved in N-methylpyrrolidone (NMP) in which spherical silica fine particles having an average particle diameter of 0.3 μm were dispersed in a particle content of 0.2 percent by weight based on the polymer. Terephthalic chloride corresponding to 100 percent by mole was added to the obtained solution to polymerize with the aromatic diamine component. Subsequently, the hydrogen chloride by-produced on the polymerization was neutralized with calcium hydroxide to give the film-producing dope (the inherent viscosity of the polymer: 3.6) having a polymer concentration of 6.0 percent by weight.

The obtained film-producing dope was heated at 100° C., allowed to pass through a stainless steel-made nonwoven fabric filter having an average aperture of 8 μm, cast from a 105° C. nozzle on a polyethylene terephthalate (PET) film having a thickness of 188 μm and a surface roughness Ra of 20 nm, and then guided into a 45° C. coagulation bath comprising a 30 percent by weight aqueous solution of NMP. After three minutes, the film having a self-holding property was peeled from the PET film, subjected to a solvent-removing treatment and a salt-removing treatment in a 60° C. water-washing bath, dried on a metal roll heated at 160° C., heated with an infrared light heater controlled so that the surface temperature of the film became 300° C., and then oriented in an orientation ratio of 2.6 in the machine direction by a circumferential speed difference between a low speed roll and a high speed roll. The film was further guided to a clip-tenter, oriented in an orientation ratio of 3.7 in the transverse direction at 350° C., thermally treated at 400° C. and then wound up. Microdomain structures existed in the obtained film, and the film had good adhesivity to magnetic coatings and good electromagnetic transducing characteristics. The characteristics are shown together with other characteristics in Table 3 and Table 4.

Example 9

The same film-producing dope as in Example 8 was similarly extruded from a nozzle and then cast, in a thickness of 560 μm, on a stainless steel belt polished in a mirror surface state and having a surface roughness of 2 nm.

The cast film-producing dope was guided into a coagulation bath having the same conditions as in Example 8 in the state loaded on the belt without being dried, peeled from the belt after one minute and 30 seconds, subjected to a solvent and salt-removing treatment in a 50° C. water-washing bath, oriented in an orientation ratio of 2.9 in the machine direction and simultaneously in an orientation ratio of 2.9 in the transverse direction by the use of a simultaneously biaxially orienting machine at 320° C., thermally treated at 350° C., and then wound up. The physical properties of the obtained film are shown in Table 3 and Table 4.

Example 10

The dope of the aromatic polyamide was obtained by the same method as in Example 8 except that the added fine particles were silicone resin particles having an average particle diameter of 0.5 μm and were added in an amount of 0.03 percent by weight. The obtained dope was cast on a rotary metal drum having a diameter of 2.0 m and a surface roughness of 3 nm and set in a coagulation bath by the same method as in Example 8. The composition of the coagulation bath was a 40 percent by weight aqueous solution of N-methylpyrrolidone, and the temperature of the aqueous solution was 40° C. The film-producing dope cast on the rotary metal drum was immediately guided into the coagulation bath, peeled from the metal drum after 50 seconds, and then subjected to a solvent-removing treatment and a salt-removing treatment in a 50° C. water-washing bath.

Subsequently, the cast and washed dope was dried at 200° C. for 30 seconds with a clip-tenter, oriented in an orientation ratio of 1.7 in the machine direction with a 270° C. induction-heated roll, oriented in an orientation ratio of 2.0 in the same direction with a 320° C. induction-heated roll, further oriented in an orientation ratio of 2.1 in the transverse direction at 340° C. with a clip-tenter, thermally treated at 350° C., and then wound up. The characteristics of the obtained film are shown in Table 3 and Table 4.

Example 11

A polymerization of a mixture liquid of 60 percent by mole of para-phenylenediamine with 40 percent by mole of 3,4'-diaminodiphenylether, as a diamine component, was carried out similarly to Example 8, without adding fine particles on the polymerization. A neutralization reaction was performed using calcium carbonate having an average particle diameter of 0.8 μm in an amount of 100.3 percent by mole per 100 percent by mole of terephthalic chloride to give the film-producing dope having a concentration of 6.0 percent by weight. The average particle diameter of the calcium carbonate in the dope was 0.3 μm.

Subsequently, the dope was extruded from a nozzle similarly to Example 8, cast on a stainless steel belt having a surface roughness of 1 nm. The cast dope was heated with 120° C., hot air for 20 seconds, guided into a 50° C. oagulation bath comprising a 40 percent by weight N-methylpyrrolidone (NMP) aqueous solution in the state loaded on the belt, peeled from the belt after one minute, subjected to an orientation in a ratio of 2.3 in the machine direction under a removing treatment of solvent and salt in a 70° C. water-washing bath, oriented again in a ratio of 2.2 in the transverse direction at 280° C. with a clip-tenter, and finally thermally treated at 320° C. to give the film. The characteristics of the obtained film are shown in Table 3 and Table 4.

Example 12

70 Parts by weight of anhydrous lithium chloride and then 48.6 parts by weight of para-phenylenediamine were dissolved in 1,000 parts by weight of N-methylpyrrolidone in a polymerization device. The obtained solution was cooled at 8° C., and 91.4 parts by weight of terephthalic dichloride was then added to the cooled solution in a powdery state at a time. Since solidified in the cheese-like state after several minutes, the polymerization reaction product was taken out from the polymerization device, immediately transferred to a twin-screw closed type kneader, and finely crushed in the kneader. Subsequently, the obtained finely crushed product was transferred to a Henschel mixer, mixed with the approximately same amount of water, further crushed, filtered, washed with hot water several times, and then dried in 110° C. hot air to give the para-phenylene terephthalamide (PPTA) having an inherent viscosity of 5.5.

Subsequently, the obtained PPTA was dissolved in 99.5% concentrated sulfuric acid in which spherical silica particles having an average particle diameter of 0.2 μm had preliminarily been dispersed in an amount of 0.3 percent by weight based on the polymer. The prepared dope having a polymer concentration of 11.5 percent by weight exhibited an optical anisotropic property at 60° C., and had a viscosity of 12,400 poises at the room temperature. The dope was heated to 70° C., and deaerated under vacuum, while maintained at the temperature. The dope was transferred from a tank through a filter by the use of a gear pump, cast from a die on a tantalum-made belt polished in a mirror surface state and having a surface roughness of 1 nm, blown with air having a relative humidity of about 65% and a temperature of about 90° C. to convert the cast dope into the optically isotropic cast dope, and then guided together with the belt into a −20° C. 30 percent by weight aqueous sulfuric acid solution to coagulate the cast dope. After 5 seconds, the coagulated film was peeled from the belt, and then subjected to a solvent-removing treatment and a salt-removing treatment in a 40° C. water-washing bath. Subsequently, the film was oriented in a ratio of 1.3 in the machine direction with rollers without being dried, oriented in an orientation ratio of 1.3 in the transverse direction with a tenter, dried at 220° C. with hot air under a constant length, and further thermally treated at 450° C. under a constant length to give the aromatic polyamide film having the final thickness of 4 μm. The characteristics of the obtained film are shown in Table 3 and Table 4.

Example 13

2-Chloro-p-phenylenediamine in an amount corresponding to 90 percent by mole and 4,4'-diaminodiphenylether in an amount corresponding to 10 percent by mole were dissolved in NMP in which spherical silicone resin fine particles having an average particle diameter of 0.4 μm had preliminarily been dispersed in an amount of 0.1 percent by weight based on the polymer, mixed with terephthalic chloride in an amount corresponding to 20 percent by mole and 2-chloroterephthalic chloride in an amount corresponding to 80 percent by mole, and then stirred for two hours to finish the polymerization. The polymerization solution was neutralized with calcium hydroxide to give the aromatic polyamide solution having a polymer concentration of 11 percent by weight and a viscosity of 3,200 poises at the ordinary temperature.

The obtained solution was allowed to pass through a 10 μm cut filter and then cast from a nozzle on a polyethylene-2,6-naphthalate (PEN) film having a thickness of 125 μm in and a surface roughness of 9 nm, and immediately guided into a 35° C. coagulation bath comprising a 40 percent by weight NMP aqueous solution. After ten seconds, the film obtained the self holding property was continuously peeled from the PEN film, guided into a 50° C. water tank to extract the residual solvent and the inorganic salt by-produced by the neutralization reaction, and simultaneously oriented in an orientation ratio of 1.2 in the machine direction. Subsequently, the film was guided to a clip-tenter, dried at 280° C., simultaneously oriented in ratio of 1.2 in the transverse direction, and then thermally set at 300° C. to give the aromatic polyamide film having the final thickness of 6 μm. The characteristics of the obtained film are shown in Table 3 and Table 4.

Comparative Example 3

The same film-producing dope as in Example 8 was similarly extruded from a nozzle and then cast on a stainless steel belt polished in a mirror surface state and having a surface roughness of 2 nm in a thickness of 560 μm. The cast film-producing dope (thin filmy product) was dried at 110° C. for one minute, at 150° C. for two minutes and further at 180° C. for two minutes to give the non-oriented film having the self-holding property. The non-oriented film was peeled from the belt, guided into a 50° C. water tank to remove the solvent and the salt, oriented in an orientation ratio of 2.9 in the machine direction with a simultaneously biaxially orienting machine at a temperature of 320° C., thermally treated at 350° C., and then wound up.

A microdomain structure did not exist in the obtained film, and the adhesivity of the film was also low. In addition, it is obvious that the productivity of the film is also inferior to that in Example 2. The other characteristics of the film are shown in Table 3 and Table 4.

Comparative Example 4

The same film-producing dope as in Example 8 was similarly extruded from a nozzle and then cast on a PET film having a thickness of 188 μm and a surface roughness of 20 nm. The cast film-producing dope was immediately guided into a 45° C. coagulation bath comprising a 30 percent by weight NMP aqueous solution, peeled from the PET film after 15 seconds, subjected to a solvent-removing treatment and a salt-removing treatment in a 60° C. water-washing bath, dried at 200° C. for one minute, and then wound up. The obtained film had a low planar orientation coefficient of 0.11 and low electromagnetic transducing characteristics. The other characteristics of the film are shown in Table 3 and Table 4.

Comparative Example 5

A polymer solution obtained by the same method as in Example 8 was extruded from a nozzle and then cast on a PET film having a thickness of 188 μm and a surface roughness of 20 nm, immediately guided into a 60° C. coagulation bath comprising a 30 percent by weight NMP aqueous solution, peeled from the PET film after two minutes, subjected to a solvent-removing and salt-removing treatment in a 60° C. water-washing bath, further subjected to drying, orienting and thermal treatments similarly to Example 8 to give the aromatic polyamide film having a final thickness of 6 μm. The obtained film had large microdomain structure sizes, therefore had a large surface roughness, and also gave inferior electromagnetic transducing characteristics, when processed into a magnetic tape. The other characteristics of the film are shown in Table 3 and Table 4.

As obviously shown in Table 3 and Table 4, the films of Examples simultaneously achieve excellent surface flatness, good adhesivity and good productivity, while the films of Comparative Examples can not satisfy the characteristics.

TABLE 3

| | Thickness just after cast mm | Microdomain structure Presence or absence of existence | Microdomain structure Size nm | Orientation ratio In the machine direction | Orientation ratio In the transverse direction | Thermal set temperature °C. | Final thickness μm | Planar orientation coefficient |
|---|---|---|---|---|---|---|---|---|
| Example 8 | 0.96 | presence | 120 | 2.6 | 3.7 | 400 | 6 | 0.46 |
| Example 9 | 0.56 | presence | 300 | 2.9 | 2.9 | 350 | 4 | 0.48 |
| Example 10 | 0.36 | presence | 230 | 3.4 | 2.1 | 350 | 3 | 0.38 |
| Example 11 | 0.51 | presence | 80 | 2.3 | 2.2 | 320 | 6 | 0.29 |
| Example 12 | 0.06 | presence | 15 | 1.3 | 1.3 | 450 | 4 | 0.49 |
| Example 13 | 0.10 | presence | 20 | 1.2 | 1.4 | 300 | 6 | 0.45 |
| Comparative Example 3 | 0.56 | absence | — | 2.9 | 2.9 | 350 | 4 | 0.48 |
| Comparative Example 4 | 0.10 | presence | 160 | — | — | — | 6 | 0.11 |
| Comparative Example 5 | 0.96 | presence | 670 | 2.6 | 3.7 | 400 | 6 | 0.46 |

TABLE 4

| | Young's modulus In the machine direction N/mm² | Young's modulus In the width direction N/mm² | Film surface roughness Support surface side nm | Film surface roughness Non-support surface side nm | Adhesive strength g/cm | Electromagnetic transducing characteristic dB |
|---|---|---|---|---|---|---|
| Example 8 | 12000 | 14000 | 8 | 7 | 70 | ±0 |
| Example 9 | 14000 | 14000 | 7 | 7 | 70 | +2 |
| Example 10 | 17000 | 9000 | 6 | 7 | 85 | ±0 |
| Example 11 | 8500 | 8500 | 6 | 7 | 90 | ±0 |
| Example 12 | 16000 | 15000 | 9 | 9 | 30 | +1 |
| Example 13 | 13000 | 15000 | 7 | 6 | 40 | +1 |
| Comparative Example 3 | 14000 | 14000 | 6 | 7 | 5 | ±0 |
| Comparative Example 4 | 4000 | 4000 | 7 | 7 | 100 | −2 |

Utilization in Industry

The aromatic polyamide film of the present invention is suitable for uses in printed circuit boards and magnetic recording media. In addition, the film can be produced in good productivity by the method for producing the aromatic polyamide film in the present invention.

What is claimed is:

1. An aromatic polyamide film comprising an aromatic polyamide, having microdomain structures having sizes of not less than 5 nm and not more than 600 nm.

2. The aromatic polyamide film according to claim 1, wherein the coefficient of thermal expansion of the film is not more than 36 ppm/°C. in the range of 30° C. to 280° C.

3. The aromatic polyamide film according to claim 1, wherein the breaking elongation of the film is not less than 5% and less than 100%.

4. The aromatic polyamide film according to claim 1, wherein the surface roughness Ra of the film is not less than 0.25 nm and less than 25 nm, and the planar orientation coefficient of the film is not less than 0.16 and not more than 0.60.

5. The aromatic polyamide film according to claim 4, wherein the Young's modulus of the film in an arbitrary in-plane direction is not less than 6000 N/mm² and less than 40000 N/mm².

6. A method for producing an aromatic polyamide film having microdomain structures having a size of 5 to 600 nm via a casting process of film-producing dope, a coagulating process, a water-washing process, and a drying process, comprising casting a film-producing dope comprising an aromatic polyamide solution from a nozzle on a support in a thin film state, in the first casting process, forming a film by coagulating the aromatic polyamide with at least adopting a wet bath system comprising an aqueous solution of a good solvent for the aromatic polyamide and with removing the solvent component of the film-producing dope from the thin filmy product cast on the support, in the subsequent coagulation process, washing the coagulated film with water and peeling the film from the support, in the subsequent water-washing process, and drying the coagulated film, in the subsequent drying process, wherein the relation of a time T (minute) and a thickness t (mm) satisfies the following expression (1);

$$1.2t\,(t+1) \leq T \tag{1}$$

(wherein the time T means the time from the start of the coagulation process to the peeling of the coagulated film from the support and the thickness t means the thickness of the thin filmy product on the support just after being cast), wherein the method further comprises thermally treating the coagulated film at a temperature of not less than 250° C. and not more than 700° C., after the drying process to form an aromatic polyamide film having microdomain structures having a size of 5 to 600 nm.

7. The method for producing the aromatic polyamide film, according to claim 6, further comprising orienting the coagulated film in an area stretch ratio of 1.01 to 15 times in at least one direction, in the process after the finish of the coagulation process.

8. The method for producing the aromatic polyamide film, according to claim 7, wherein the surface roughness Ra of the support is not less than 0.5 nm and not more than 50 nm.

\* \* \* \* \*